(12) United States Patent
Shiina

(10) Patent No.: US 10,012,855 B2
(45) Date of Patent: Jul. 3, 2018

(54) DISPLAY DEVICE WITH ORGANIC INSULATING FILM HAVING A TRENCH THEREIN FORMED ON SUBSTRATE

(71) Applicant: Japan Display Inc., Tokyo (JP)

(72) Inventor: Hideki Shiina, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/725,520

(22) Filed: Oct. 5, 2017

(65) Prior Publication Data

US 2018/0120623 A1    May 3, 2018

(30) Foreign Application Priority Data

Nov. 1, 2016  (JP) .................. 2016-214421

(51) Int. Cl.
- *G02F 1/1333* (2006.01)
- *G02F 1/1368* (2006.01)
- *G02F 1/1362* (2006.01)
- *H01L 27/12* (2006.01)

(52) U.S. Cl.
CPC ...... *G02F 1/133345* (2013.01); *G02F 1/1368* (2013.01); *G02F 1/13338* (2013.01); *G02F 1/136286* (2013.01); *H01L 27/1244* (2013.01); *H01L 27/1248* (2013.01); *G02F 2001/13629* (2013.01); *G02F 2001/136295* (2013.01); *G02F 2201/121* (2013.01); *G02F 2201/123* (2013.01); *G02F 2201/50* (2013.01)

(58) Field of Classification Search
CPC ..................... G02F 1/136286; H01L 27/124
See application file for complete search history.

(56) References Cited

U.S. PATENT DOCUMENTS

2015/0097192 A1    4/2015  Araki et al.

FOREIGN PATENT DOCUMENTS

JP    2015-075605 A    4/2015

*Primary Examiner* — Benjamin Sandvik
*Assistant Examiner* — Farid Khan
(74) *Attorney, Agent, or Firm* — Typha IP LLC

(57) ABSTRACT

A display device includes a pixel substrate in which a plurality of wirings and a plurality of switching elements are formed. The pixel substrate includes an organic insulating film formed over the substrate, a first wiring and a second wiring arranged in parallel on the organic insulating film, a trench formed in the organic insulating film between the first wiring and the second wiring, and a protection film formed to cover the first wiring, the second wiring, and the trench.

9 Claims, 9 Drawing Sheets

DISPLAY DEVICE WITH ORGANIC INSULATING FILM HAVING A TRENCH THEREIN FORMED ON SUBSTRATE

CROSS-REFERENCE TO RELATED APPLICATION

The present application claims priority from Japanese Patent Application No. 2016-214421 filed on Nov. 1, 2016, the content of which is hereby incorporated by reference into this application.

TECHNICAL FIELD OF THE INVENTION

The present invention relates to a display device and for example, relates to a display device adaptable to a high temperature and high humidity environmental condition.

BACKGROUND OF THE INVENTION

In recent years, a liquid crystal display device and an organic electro-luminescence (EL) display device have been used at various places and in various situations.

Especially in a small-sized display device, a display device with a touch detection function, such as a liquid crystal display device, on or with which a touch detection device, so-called a touch panel, capable of detecting proximity or contact of an object, is mounted or integrated, has been widely used. In the display device with a touch detection function, various button images and the like are displayed on the display device, and thus, information can be input through the touch panel serving as an alternative to normal mechanical buttons.

With the advent of such a display device having a touch panel, the display device has been further widely used in various situations, particularly for mobile purposes.

Japanese Patent Application Laid-Open Publication No. 2015-75605 (Patent Document 1)

SUMMARY OF THE INVENTION

In equipment in which a display device is incorporated, the display device is subjected to a high temperature and high humidity environmental test in accordance with an environmental situation to be used so as to adapt to an environmental condition under which this equipment is used. The display device includes a pixel substrate (also referred to as a TFT substrate or the like) in which switching elements such as a plurality of wirings and a thin film transistor (TFT) are formed, and further includes a counter substrate (also referred to as a color filter substrate or the like) arranged so as to face the pixel substrate if the display device is a liquid crystal display device.

In the pixel substrate, a plurality of wirings such as a video signal line or a gate signal line are formed. In recent years, the number of pixels has become higher, and high definition has been enhanced. Accordingly, the number of wirings and wiring density have increased.

Also, in recent years, a high temperature and high humidity test for a display device may be performed under much higher temperature and higher humidity condition, in some cases. Thus, moisture easily infiltrates into the display device through an insulating film formed over the pixel substrate. In particular, when the insulating film is an organic insulating film, moisture easily infiltrates into the film. Accordingly, when a potential difference occurs between the wirings at a place where wirings are densely formed, for example, at a place close to a terminal portion on the pixel substrate, this potential difference causes leak of current in the insulating film between the wirings, and as a result, moisture in the insulating film is decomposed into gases such as oxygen and hydrogen by this current. When the gases are generated like this, the wirings become oxidized, thereby causing corrosion. Further, when a liquid crystal display device is subjected to this test, this gas is mixed into a liquid crystal layer to be bubbles, thereby adversely affecting display in some cases.

An object of the present invention is to provide a display device capable of solving the problems of the conventional techniques described above.

The typical ones of the inventions disclosed in the present application will be briefly described as follows.

A display device according to one aspect of the present invention includes a substrate in which a plurality of wirings and a plurality of switching elements are formed. The substrate includes an organic insulating film formed over the substrate, a first wiring and a second wiring arranged in parallel on the organic insulating film, a trench formed in the organic insulating film between the first wiring and the second wiring, and a protection film formed to cover the first wiring, the second wiring, and the trench.

BRIEF DESCRIPTIONS OF THE DRAWINGS

DESCRIPTIONS OF THE PREFERRED EMBODIMENT

Figure 1:
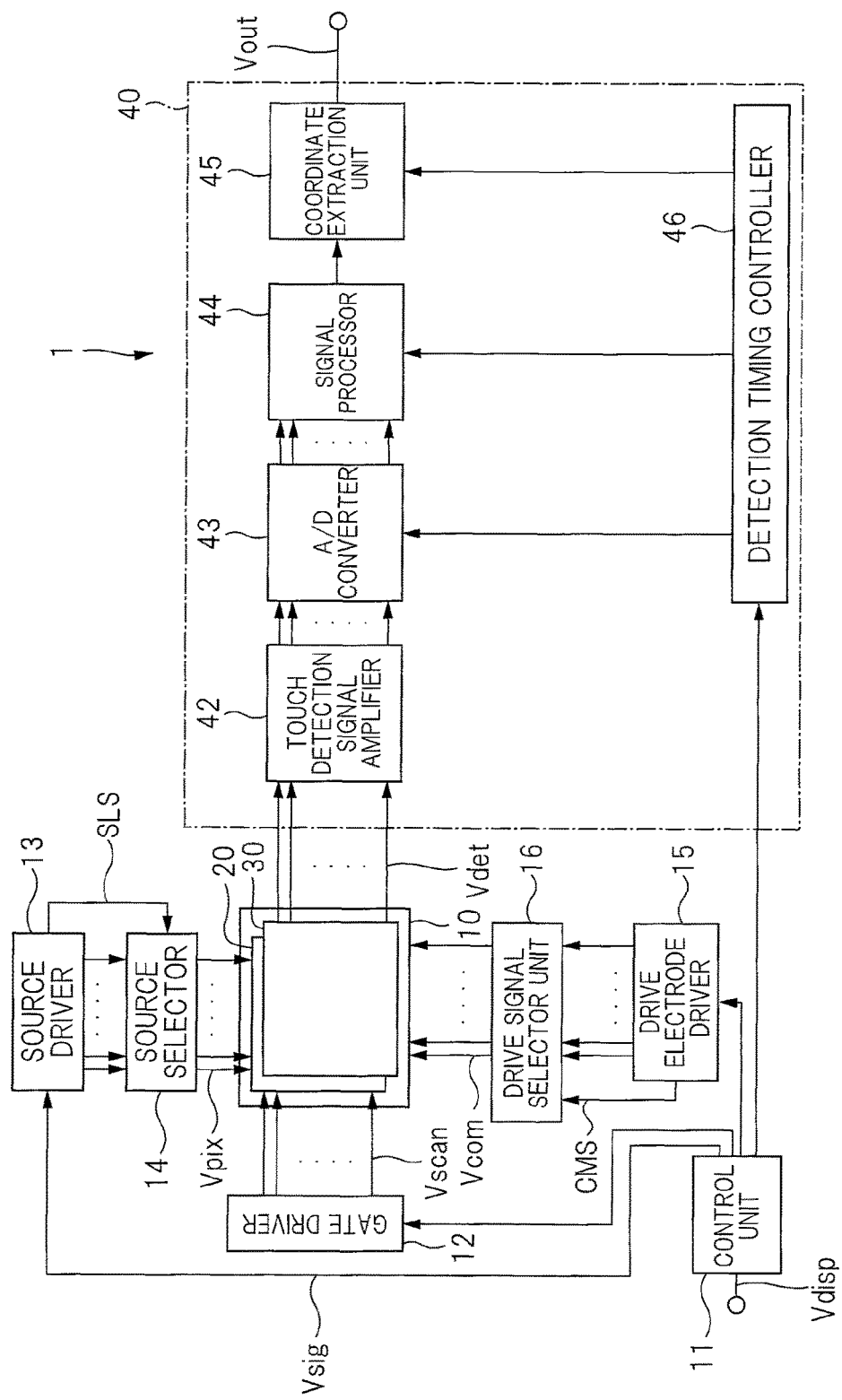
FIG. 1 is a block diagram illustrating an example of a schematic configuration of a liquid crystal display device with a touch detection function according to an embodiment.

Hereinafter, an embodiment of the present invention will be described with reference to the drawings. Note that this disclosure is an example only and suitable modifications which can be easily conceived by those skilled in the art without departing from the gist of the present invention are included within the scope of the invention as a matter of course. In addition, in order to further clarify the description, a width, a thickness, a shape, and the like of respective portions may be schematically illustrated in the drawings as compared to aspects of the embodiment, but they are examples only and do not limit the interpretation of the present invention.

In addition, in this specification and the respective drawings, the same components described in the drawings which have been described before are denoted by the same reference characters, and detailed description thereof may be omitted as needed. In addition, in some drawings used in the embodiment, hatching may be omitted even in a cross-sectional view so as to make the drawings easy to see. Also, hatching may be used even in a plan view so as to make the drawings easy to see.

Embodiment

A technique to be described in the following embodiment can be widely applied to a display device including a mechanism of supplying a signal to a plurality of elements in a display region provided with an optical element layer from a peripheral region around the display region. Examples of the above display device are various display devices each including a liquid crystal, an organic light emitting diode (OLED), a micro electro mechanical system (MEMS) shutter, or the like as the optical element layer.

In the following embodiment, a liquid crystal display device will be described as the display device; however, the other application examples include all flat-panel display devices such as an organic EL display device and a self-luminous display device other than the organic EL display device.

Hereinafter, an example in which the present invention is applied to a liquid crystal display device with a touch detection function (also referred to as an in-cell touch panel) will be described as an embodiment. The liquid crystal display device with a touch detection function has, in general, a structure in which a detection electrode for touch detection is provided on both a pixel substrate (also referred to as a TFT substrate) and a counter substrate (also referred to as color filter substrate or the like) and a structure in which a detection electrode for touch detection is provided on either side of a counter substrate.

In the present embodiment, the former structure will be described by way of example. In this structure, of a pixel electrode and a common electrode for driving a liquid crystal, the common electrode serves as the detection electrode for touch detection.

<Liquid Crystal Display Device with Touch Detection Function>

First, a configuration of a liquid crystal display device with a touch detection function according to the present embodiment will be described with reference to FIG. 1. FIG. 1 is a block diagram illustrating an example of a schematic configuration of a liquid crystal display device with a touch detection function according to the present embodiment.

A liquid crystal display device 1 with a touch detection function includes a display unit 10 with a touch detection function, a controller 11, a gate driver 12, a source driver 13, a source selector 14, a drive electrode driver 15, a drive signal selector unit 16, and a touch detector 40. The liquid crystal display device 1 with a touch detection function is a display device in which the display unit 10 with a touch detection function incorporates a touch detection function.

The display unit 10 with a touch detection function is a so-called in-cell type device in which a display region 20 including a liquid crystal display element as a display element and a capacitive touch detection unit 30 are integrated. Note that the display unit 10 with a touch detection function may be a so-called on-cell type device in which the capacitive touch detection unit 30 is mounted on the display region 20 including the liquid crystal display element as the display element.

The display region 20 is a device performing display by sequentially scanning horizontal lines one by one according to a scan signal Vscan supplied from the gate driver 12.

The controller 11 is a circuit supplying a control signal to the gate driver 12, the source driver 13, the drive electrode driver 15, and the touch detector 40 according to a video signal Vdisp supplied from outside and causing the gate driver 12, the source driver 13, the drive electrode driver 15, and the touch detector 40 to operate in synchronization with one another.

The gate driver 12 has a function of sequentially selecting one horizontal line which is a target for display drive of the display region 20 according to a control signal supplied from the controller 11.

The source driver 13 is a circuit supplying a pixel signal Vpix to each of pixels Pix (subpixels SPix) to be described later (FIG. 5) of the display region 20 according to a control signal supplied from the controller 11. The source driver 13 generates a pixel signal obtained by time-division multiplexing the pixel signals Vpix of the plurality of subpixels SPix of the display region 20, and supplies the pixel signal to the source selector 14.

Figure 4:
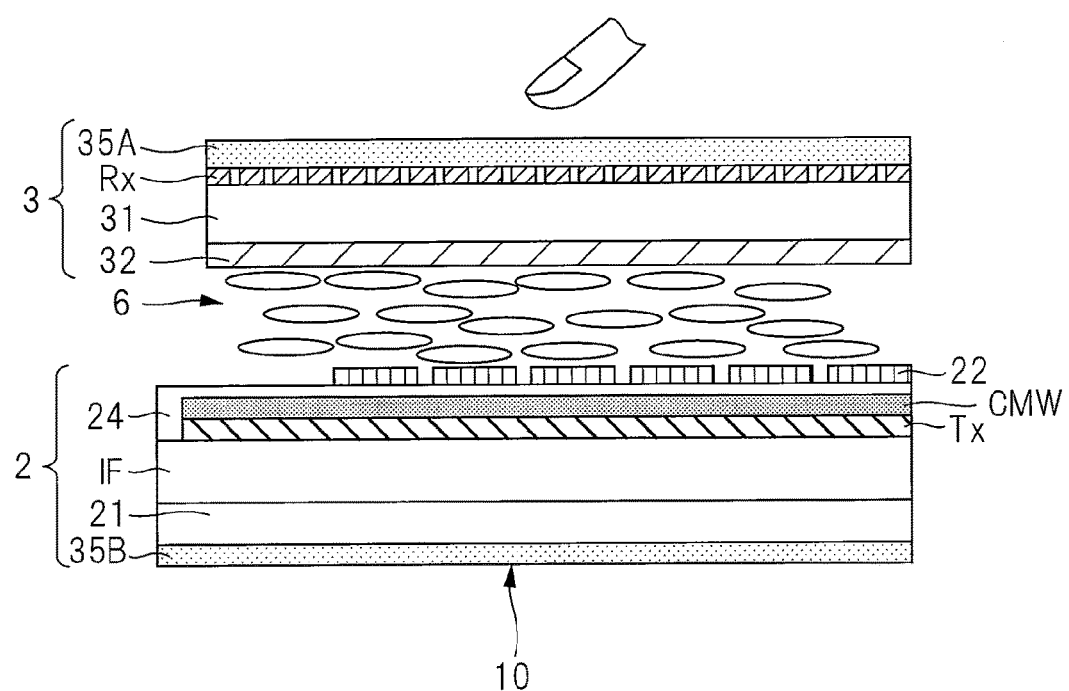
FIG. 4 is a cross-sectional view illustrating an example of a schematic cross-sectional structure of a display unit with a touch detection function according to the embodiment.

In addition, the source driver 13 generates a switch control signal SLS necessary for separating the pixel signal Vpix multiplexed into an image signal Vsig, and supplies the switch control signal SLS together with the pixel signal Vpix to the source selector 14. The source selector 14 performs multiplexer driving for supplying the pixel signal Vpix such that writing is sequentially performed for each subpixel SPix corresponding to each color of a color filter 32 to be described later (FIG. 4).

The drive electrode driver 15 is a circuit supplying a drive signal Vcom to a drive electrode Tx to be described later (FIG. 2) of the display unit 10 with a touch detection function according to a control signal supplied from the controller 11. The drive signal selector unit 16 selects the drive electrode Tx to which drive signal Vcom is supplied according to a switch control signal CMS generated by the drive electrode driver 15.

The touch detection unit 30 is a device which operates based on a principle of capacitive touch detection and outputs a touch detection signal Vdet. The capacitive touch detection includes a so-called mutual-capacitance detection method and a so-called self-capacitance detection method. The mutual-capacitance detection method is a method of detecting coordinates of proximity or contact of an object by using changes in electrostatic capacitance between the drive electrode Tx and a detection electrode Rx described later (FIG. 4) due to proximity or contact of an object such as a finger of a user. The self-capacitance detection method is a method of detecting proximity or contact of an object by using changes in ground capacitance of the detection electrode Rx due to proximity or contact of an object such as a finger of a user. The method described in the present embodiment is the mutual-capacitance detection method.

The touch detection unit 30 is configured to supply, to the drive electrode Tx, the drive signal Vcom supplied from the drive electrode driver 15 via the drive signal selector unit 16 as a drive signal Vcom for touch detection (hereinafter also referred to as a touch drive signal Vcom), sequentially scan detection blocks one by one according to the touch drive signal Vcom, and perform touch detection.

The touch detection unit 30 is configured to output the touch detection signal Vdet for each detection block from a plurality of touch detection electrodes Rx to be described later (FIG. 4), and supply the touch detection signal Vdet to the touch detector 40.

The touch detector 40 is a circuit which detects presence or absence of touch (proximity state or contact state) on the touch detection unit 30 according to the control signal supplied from the controller 11 and the touch detection signal Vdet supplied from the touch detection unit 30 of the display unit 10 with a touch detection function, and determines coordinates of the touch in a touch detection region in a case where the touch is detected. The touch detector 40 includes a touch detection signal amplifier 42, an A/D (Analog to Digital) converter 43, a signal processor 44, a coordinate extraction unit 45, and a detection timing controller 46.

The touch detection signal amplifier 42 amplifies the touch detection signal Vdet supplied from the touch detection unit 30. Note that the touch detection signal amplifier 42 may include a low-pass analog filter removing high-frequency components (noise components) included in the touch detection signal Vdet and extracting and outputting touch components.

The A/D converter 43 is a circuit which samples analog signals output from the touch detection signal amplifier 42, at a timing in synchronization with the drive signal Vcom and converts the analog signals into digital signals.

The signal processor 44 includes a digital filter which removes frequency components (noise components) included in output signals from the A/D converter 43 and higher than the frequency at which the touch drive signal Vcom is sampled and which extracts the touch components. The signal processor 44 is a logic circuit which detects presence or absence of touch on the touch detection unit 30 according to the output signals from the A/D converter 43.

The coordinate extraction unit 45 is a logic circuit which determines touch panel coordinates of touch when the touch is detected in the signal processor 44. The detection timing controller 46 causes the A/D converter 43, the signal processor 44, and the coordinate extraction unit 45 to operate in synchronization with one another. The coordinate extraction unit 45 outputs the touch panel coordinates as a signal output Vout.

<Structure of Pixel Substrate>

Figure 2:
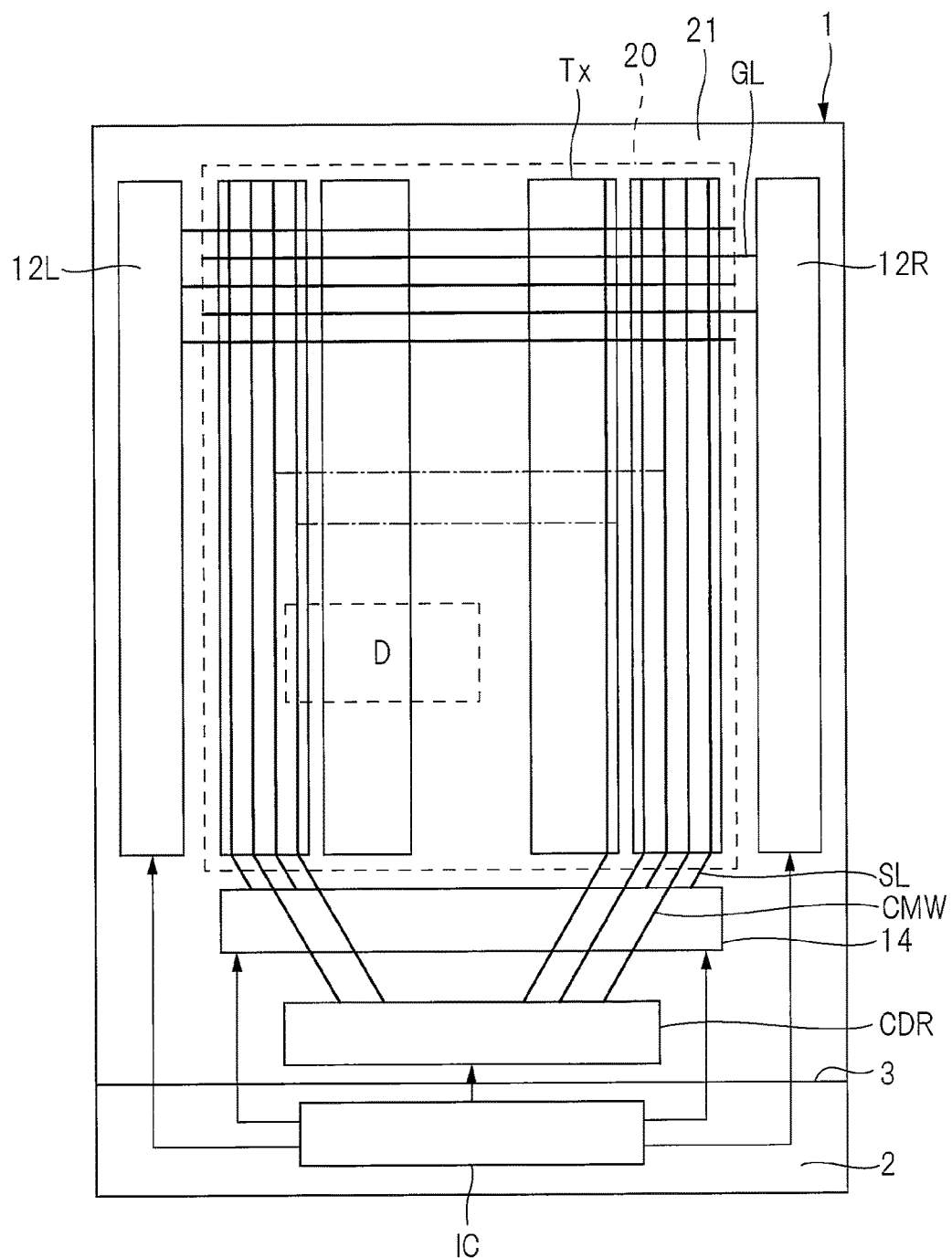
FIG. 2 is a plan view illustrating an example of pixel substrate used in the liquid crystal display device with a touch detection function according to the embodiment.

FIG. 2 is a plan view illustrating an example of the pixel substrate used in the liquid crystal display device with a touch detection function according to the present embodiment.

As illustrated in FIG. 2, the liquid crystal display device 1 with a touch detection function includes the display region 20, gate drivers 12L and 12R, the source selector 14, a drive electrode drive circuit CDR, and a driver chip IC.

The gate drivers 12L and 12R, the source selector 14, and the drive electrode drive circuit CDR are formed on a TFT substrate 21, which is a glass substrate. Among these, the source selector 14 and the drive electrode drive circuit CDR are formed on a lower side of the display region 20 (on a short side of the TFT substrate 21) in a plan view. The gate drivers 12L and 12R are formed on the left and the right (on long sides of the TFT substrate 21) across the display region 20 in a plan view, respectively. The gate driver 12L is formed on the left side, and the gate driver 12R is formed on the right side.

The driver chip IC is an IC (Integrated Circuit) chip mounted on the TFT substrate 21, and incorporates circuits necessary for display operation such as the controller 11, the source driver 13, and the like illustrated in FIG. 1. The driver chip IC is mounted on the lower side of the drive electrode drive circuit CDR in a plan view. A portion of the TFT substrate 21 on which the driver chip IC is mounted may be referred to as a panel. Note that, in the liquid crystal display device 1 with a touch detection function, the driver chip IC may incorporate a circuit such as the gate driver 12. Also, an end of the counter substrate 3 is located between the driver chip IC and the drive electrode drive circuit CDR, as illustrated in FIG. 2. Accordingly, the driver chip IC is arranged on a portion of the TFT substrate 21 not overlapping with the counter substrate 3.

The drive electrode drive circuit CDR is a circuit including the drive electrode driver 15 and the drive signal selector unit 16 illustrated in FIG. 1. The drive electrode drive circuit CDR switches an output to the drive electrode Tx as the common electrode in display, and an output of the drive electrode in touch detection. When touch is detected, as described above, the drive electrode drive circuit CDR selects the drive electrode Tx outputting the drive signal Vcom.

The source selector 14 is a circuit which connects between a video signal line SL and the source driver 13 in the driver chip IC. The source selector 14 selects an appropriate video signal line SL and outputs the video signal output from the source driver 13 in a time-division manner. Thus, the number of wirings between the source driver 13 and the source selector 14 can be made smaller than the number of the video signal lines SL.

Figure 3A:
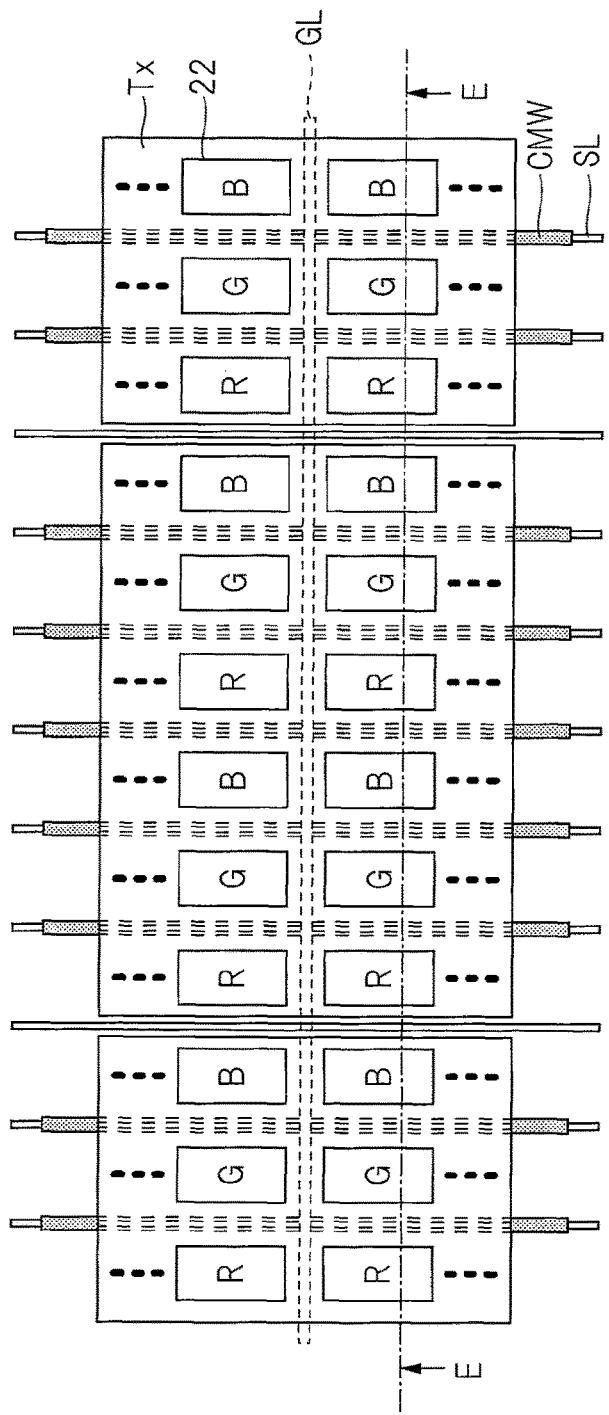
FIG. 3A is a schematic view of a partial region of a display region of FIG. 2 in a plan view.
Figure 3B:
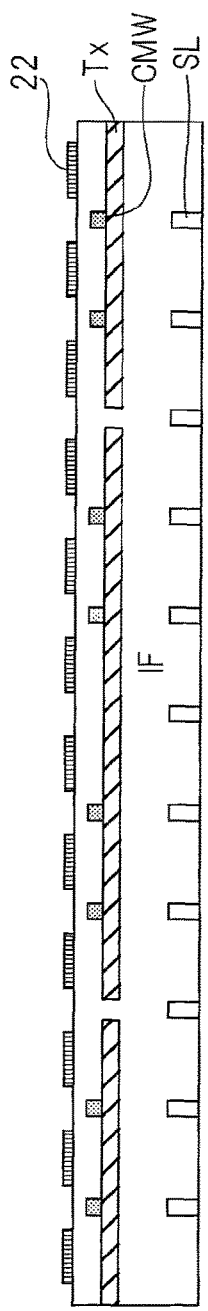
FIG. 3B is a cross-sectional view illustrating a cross-sectional structure taken along a short side direction of the region in FIG. 3A.

FIG. 3A is a schematic view of a partial region (D portion in FIG. 2) of the display region 20 of FIG. 2 in a plan view. FIG. 3B is a cross-sectional view illustrating a cross-sectional structure taken along a short side direction (an E-E section line in FIG. 3A) of the region in FIG. 3A.

In the display region 20 of the liquid crystal display device 1 with a touch detection function, in a vertical direction (in a plan view) relative to a front surface of the TFT substrate 21, the drive electrode Tx is formed, and a plurality of scan signal lines GL and video signal lines SL are formed in a region overlapping with the drive electrode Tx. The drive electrode Tx extends in a long side direction (longitudinal direction) of the display region 20 and is formed to be divided in the short side direction (lateral direction). Regarding a size of the drive electrode Tx in a short side direction (width direction), the drive electrode Tx is formed across a plurality of pixel regions, and accordingly, the drive electrode Tx overlaps with a plurality of pixel electrodes 22 and the plurality of video signal lines SL. Note that each pixel electrode 22 in FIG. 3A is denoted by the color (red (R), green (G), and blue (B)) of the corresponding color filter.

The detection electrode Rx described later (FIG. 4) extends in a short side direction of the display unit 10 with a touch detection function, and a plurality of the detection electrodes Rx are formed in parallel in a long side direction. An output of the detection electrode Rx is connected to the touch detector 40 (see FIG. 1) mounted outside the module via a terminal portion constituted by a flexible printed board and the like.

<Display Unit with Touch Detection Function>

Figure 5:
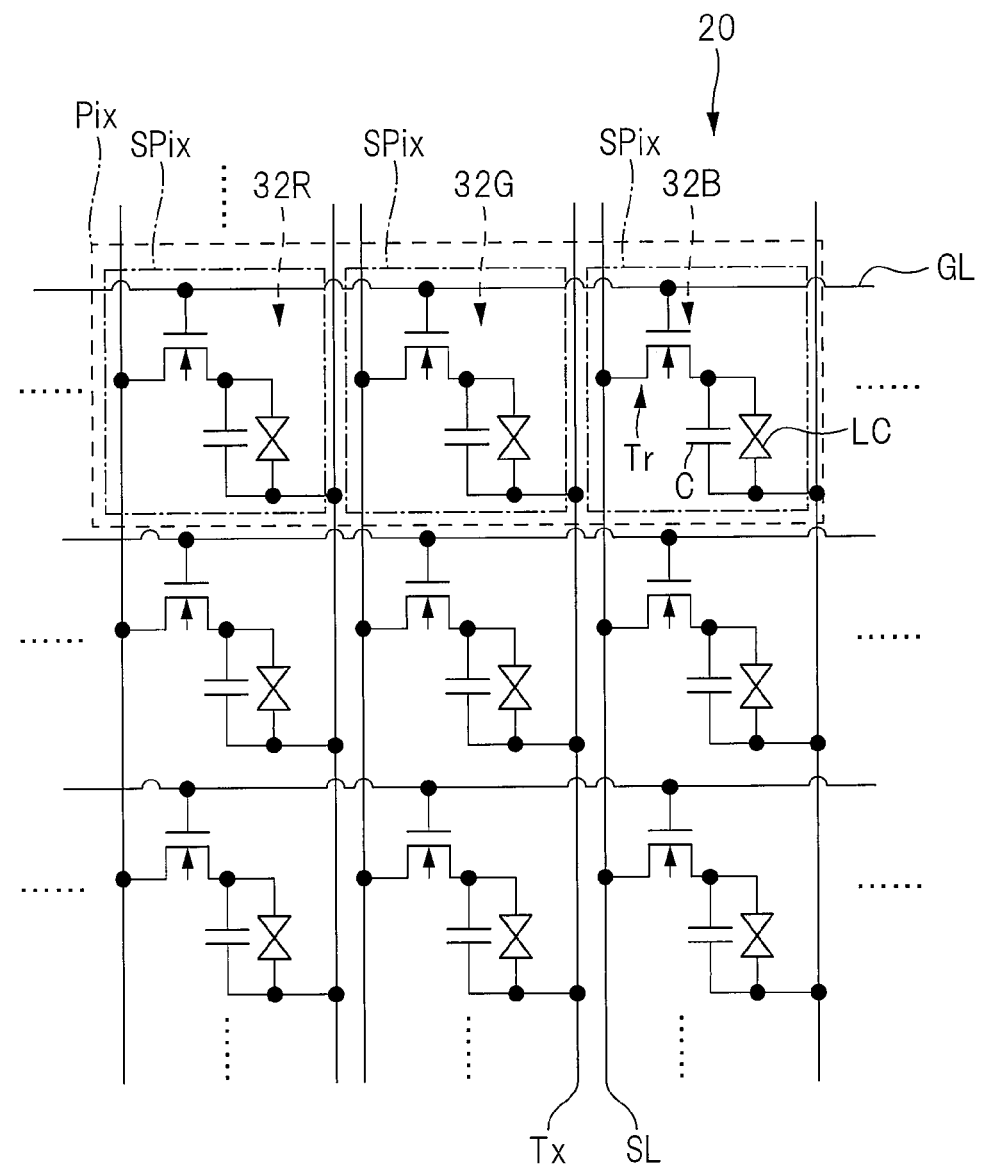
FIG. 5 is a circuit diagram illustrating an example of a pixel array in the display region according to the embodiment.

Next, a configuration example of the display unit 10 with a touch detection function described above will be described in detail. FIG. 4 is a cross-sectional view illustrating an example of a schematic cross-sectional structure of the display unit 10 with a touch detection function according to the present embodiment, in the long side direction. FIG. 5 is a circuit diagram illustrating an example of a pixel array in the display region 20 according to the present embodiment.

As illustrated in FIG. 4, the display unit 10 with a touch detection function includes a pixel substrate 2, the counter substrate 3 arranged to face a front surface of the pixel substrate 2 in a vertical direction, and a liquid crystal layer 6 as an optical element layer interposed between the pixel substrate 2 and the counter substrate 3.

The liquid crystal layer 6 is composed of a plurality of liquid crystal molecules, and causes light passing through the liquid crystal layer 6 to be modulated according to a state of an electric field. Note that an alignment film may be arranged between the liquid crystal layer 6 and the pixel substrate 2, and between the liquid crystal layer 6 and the counter substrate 3, illustrated in FIG. 4.

The counter substrate 3 includes a glass substrate 31 and the color filter 32 formed on one surface (on a side of the liquid crystal layer 6) of the glass substrate 31. The touch detection electrodes Rx, which are detection electrodes of the touch detection unit 30, are formed on the other surface of the glass substrate 31. Further, a polarizer 35A is disposed over the touch detection electrodes Rx.

The pixel substrate 2 includes the TFT substrate 21 as a circuit substrate, and a polarizer 35B stuck over a surface of the TFT substrate 21 on a side opposite to the liquid crystal layer 6.

On the side of the liquid crystal layer 6 of the TFT substrate 21, the scan signal line GL, the switching element formed of a TFT, and the video signal line SL are formed (illustration of these are omitted in FIG. 4). Over the layer in which the scan signal line GL, the switching element formed of the TFT, and the video signal line SL are formed, an organic insulating film IF is formed. On the organic insulating film IF, the drive electrode Tx formed of a transparent conductive film such as indium tin oxide (ITO) is formed. Since the ITO has generally a high resistance value, a common wiring CMW made of metals is formed on the drive electrode Tx in order to reduce the resistance value.

An insulating film 24 is formed over the common wiring CMW, and the plurality of pixel electrodes 22 made of the ITO is formed on the insulating film 24. The pixel electrodes 22 are each formed in each pixel region surrounded by the scan signal line GL and the video signal line SL, in a plan view.

The drive electrode Tx works as a common electrode to which a reference voltage is applied, as a function of driving the liquid crystal. In the present embodiment, a fringe field switching (FFS) mode as a kind of an in-plane switching (IPS) mode in which a fringe electric field is generated between the pixel electrode 22 and the drive electrode Tx, thereby causing the liquid crystal molecules to rotate, is adopted.

The pixel electrodes 22 and the drive electrode Tx are each formed of a transparent conductive film such as the ITO as described above.

In the TFT substrate 21, a thin film transistor (TFT) element Tr of each subpixel SPix illustrated in FIG. 5 and wirings such as the video signal line SL supplying the pixel signal Vpix to each pixel electrode 22 and the scan signal line GL driving the TFT element Tr are formed. The display region 20 illustrated in FIG. 5 includes the plurality of subpixels SPix arrayed in a matrix. The subpixel SPix includes the TFT element Tr, a liquid crystal element LC, and a holding capacitor C. The TFT element Tr is constituted by a thin film transistor and in this example, constituted by an n-channel metal oxide semiconductor (MOS) TFT. A source of the TFT element Tr is connected to the video signal line SL, a gate of the TFT element Tr is connected to the scan signal line GL, and a drain of the TFT element Tr is connected to one end of the liquid crystal element LC. The liquid crystal element LC has the one end connected to the drain of the TFT element Tr and the other end connected to the drive electrode Tx. The liquid crystal element LC is a display functional layer exerting an image display function based on the image signal Vpix. The holding capacitor C has one end connected to the drain of the TFT element Tr and the other end connected to the drive electrode Tx.

One subpixel SPix is connected to another subpixel SPix in the same line in the display region 20 through the scan signal line GL. The scan signal line GL is connected to the gate driver 12, and the gate driver 12 supplies the scan signal Vscan. Also, one subpixel SPix is connected to another subpixel SPix in the same column in the display region 20 through the video signal line SL. The video signal line SL is connected to the source driver 13, and the source driver 13 supplies the image signal Vpix. The drive electrode Tx is connected to the drive electrode driver 15 via the drive signal selector unit 16, and the drive electrode driver 15 supplies the drive signal Vcom. That is, in this example, the plurality of subpixels SPix in the same column share a line of the drive electrode Tx.

When the display unit 10 with a touch detection function displays a video image, the gate driver 12 illustrated in FIG. 1 applies the scan signal Vscan to the gate of the TFT element Tr of the subpixel SPix via the scan signal line GL illustrated in FIG. 5 and sequentially selects one line (one horizontal line) of the subpixels SPix formed in a matrix in the display region 20, as a target for display drive. The source driver 13 illustrated in FIG. 1 supplies the pixel signal Vpix to each of the subpixels SPix constituting the one horizontal line sequentially selected by the gate driver 12, via the video signal line SL illustrated in FIG. 5. Meanwhile, the drive electrode driver 15 illustrated in FIG. 1 applies the drive signal Vcom to each of the plurality of drive electrodes Tx illustrated in FIG. 4, FIG. 5, and the like via the drive signal selector unit 16. With such operation, in the selected subpixels SPix, display of one horizontal line is performed according to the supplied pixel signals Vpix.

Also, when the display unit 10 with a touch detection function performs touch detection, the drive electrode driver 15 sequentially applies touch detection voltage to each of the plurality of drive electrodes Tx via the drive signal selector unit 16.

Meanwhile, the touch detector 40 connected to the detection electrode Rx detects changes in voltage of the detection electrode Rx during a period in which the touch detection drive voltage is applied to the drive electrode Tx, and performs touch detection.

Thus, the drive electrode Tx functions as a common electrode of the display region 20 in video image display and as a drive electrode of the touch detection unit 30 in touch detection.

In the color filter 32 illustrated in FIG. 4, color regions of the color filter which are colored, for example, in three colors of red (R), green (G), and blue (B) are periodically arrayed, and color regions 32R, 32G, and 32B in three colors of R, G, and B are associated with the above-described subpixels SPix illustrated in FIG. 5 such that one set of the color regions 32R, 32G, and 32B constitutes the pixel Pix. As described, the subpixel SPix can perform color display in a single color. The color filter 32 faces the liquid crystal layer 6 in the direction vertical to the TFT substrate 21. Note that the color filter 32 may be a combination of other colors as long as the color filter 32 is colored in different colors. The color filter 32 may be omitted. As described, a region where there is no color filter, that is, a transparent subpixel may be provided.

<High Temperature and High Humidity Environmental Test>

Figure 11:
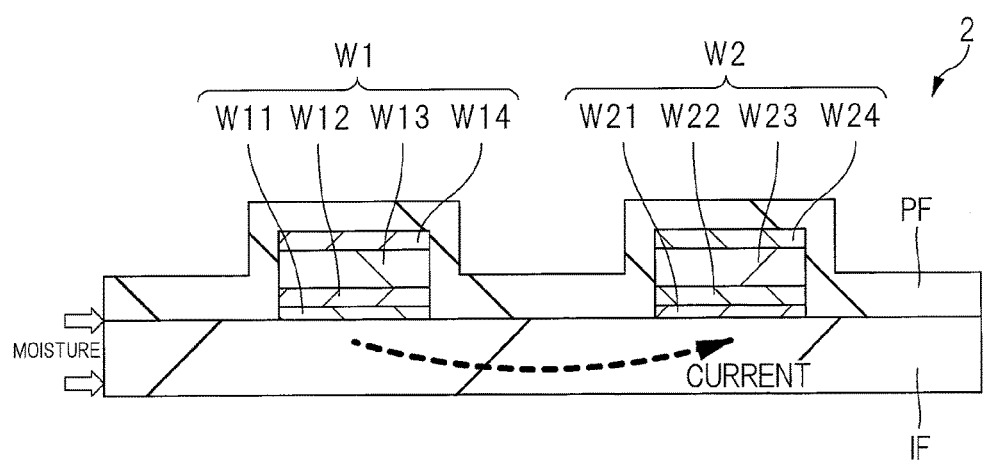
FIG. 11 is a cross-sectional view illustrating a wiring structure of a conventional pixel substrate in a comparative example of the liquid crystal display device with a touch detection function according to the embodiment.

The above-described liquid crystal display device 1 with a touch detection function is, for example, subjected to the high temperature and high humidity environmental test in order to adapt to the environmental condition under which this display device 1 is used. As described in FIG. 4, the display device 1 includes the pixel substrate 2, and the counter substrate 3 arranged to face the pixel substrate 2. An example of the pixel substrate 2 is a substrate having a wiring structure described in FIG. 11. FIG. 11 is a cross-sectional view illustrating a wiring structure of a conventional pixel substrate in a comparative example of the liquid crystal display device with a touch detection function according to the present embodiment. As described in FIG. 11, the wiring structure of the pixel substrate 2 according to the comparative example of the present embodiment includes a first wiring W1 and a second wiring W2 arranged in parallel on the organic insulating film IF over the TFT substrate 21 (see FIGS. 2, 4, and the like). These wirings correspond to the common wiring CMW in FIG. 2.

In the high temperature and high humidity environmental test of the display device including such pixel substrate 2, moisture infiltrating into the panel due to a potential difference between the first wiring W1 and the second wiring W2 causes a chemical reaction, and the first wiring W1 and the second wiring W2 may corrode in some cases. In addition, a generated gas is stored in the liquid crystal layer to be bubbles, adversely affecting display.

Regarding a passage through which moisture from a peripheral environment goes, it is considered that moisture penetrates inside the organic insulating film IF which is likely to contain moisture or goes through an interface between the organic insulating film IF, and the first wiring W1 and the second wiring W2.

Thus, an object of the present invention is to provide a display device capable of solving the problem in the wiring structure according to the comparative example described above and preventing a chemical reaction caused by moisture. In the liquid crystal display device 1 with a touch detection function according to the present embodiment, a wiring structure of the pixel substrate 2 will be described below.

<Wiring Structure of Pixel Substrate>

Figure 6:
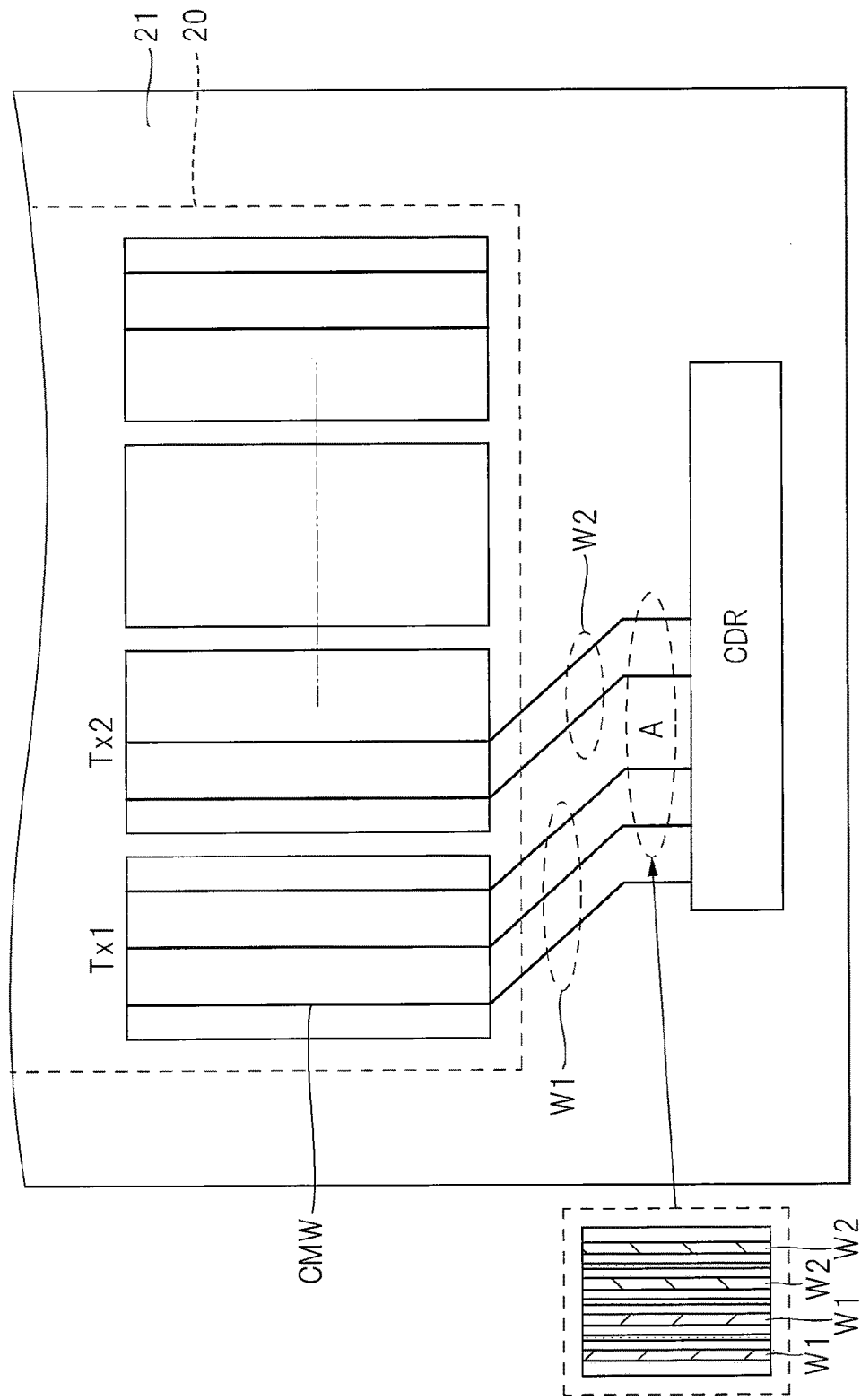
FIG. 6 is a plan view illustrating an example of a wiring structure of the pixel substrate in the liquid crystal display device with a touch detection function according to the embodiment.

FIG. 6 is a plan view illustrating an example of a wiring structure of the pixel substrate 2 in the liquid crystal display device 1 with a touch detection function according to the present embodiment.

The liquid crystal display device 1 with a touch detection function according to the present embodiment includes the pixel substrate 2 and the counter substrate 3 arranged to face the pixel substrate 2, as described above (FIG. 4). The pixel substrate 2 is a first substrate also referred to as a transistor (TFT) substrate or the like, and the counter substrate 3 is a second substrate also referred to as color filter substrate or the like.

As illustrated in FIG. 6 (also see FIG. 2 described above), the drive electrode drive circuit CDR is formed on the lower side of the display region 20 on the TFT substrate of the pixel substrate 2.

The drive electrode drive circuit CDR is formed to be connected to the drive electrode Tx in the display region 20 through the common wiring CMW.

The present embodiment has a feature in a structure of the organic insulating film IF between the wirings outside the display region of the common wiring CMW connected to the drive electrode Tx. Note that the present embodiment may be applied to not only the common wiring CMW connected to the drive electrode Tx, but also other wirings and particularly, applicable to a case in which the first wiring W1 and the second wiring W2 which differ from each other in potential are arranged in parallel on the organic insulating film IF.

In FIG. 6, an enlarged view illustrating a portion of the common wiring CMW connected to the drive electrode Tx is provided together. A wiring structure of the enlarged portion (A portion) will be described in detail below as a first example and a second example.

<<First Example of Wiring Structure of Pixel Substrate>>

Figure 7:
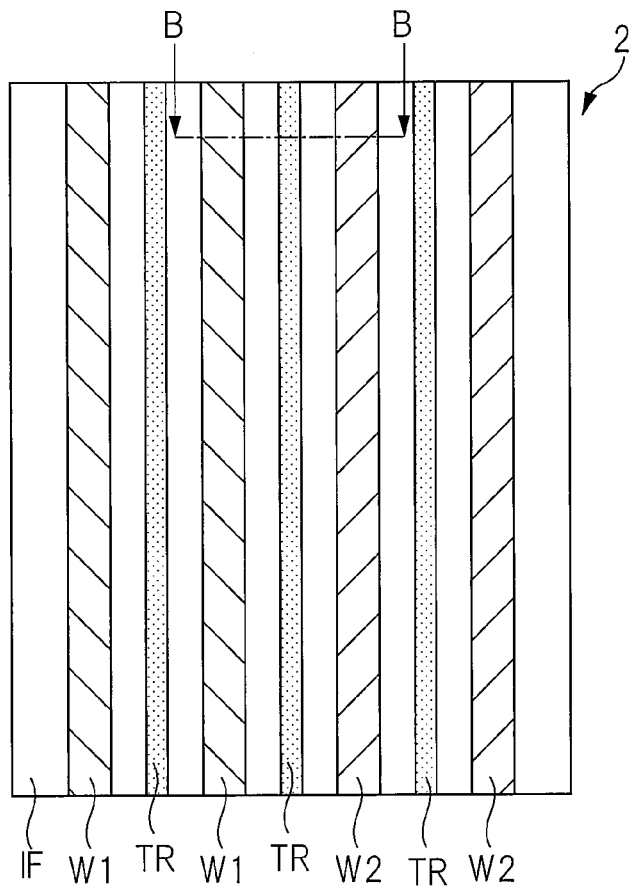
FIG. 7 is a plan view illustrating a first example of the wiring structure of the pixel substrate in FIG. 6.
Figure 8:
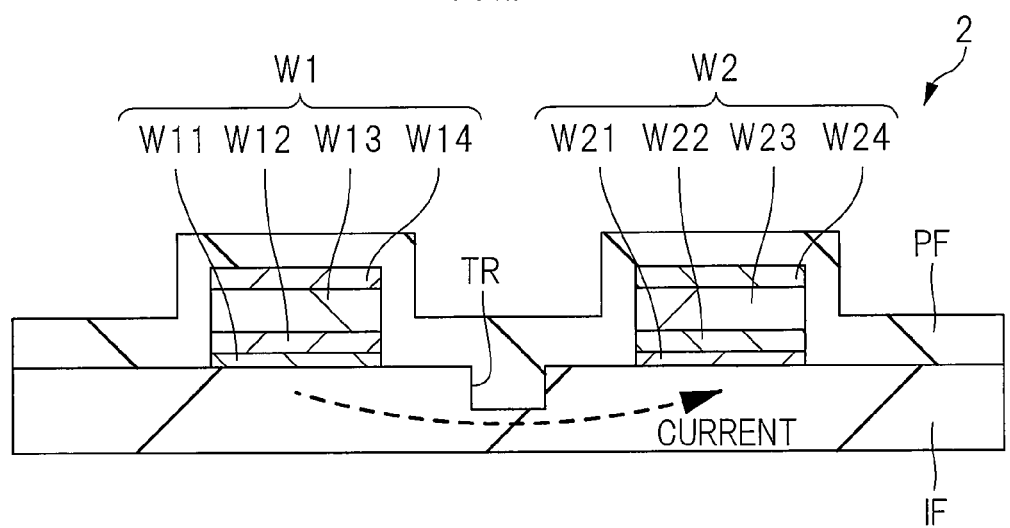
FIG. 8 is a cross-sectional view illustrating the first example of the wiring structure of the pixel substrate in FIG. 6.

The first example of the wiring structure of the pixel substrate 2 in FIG. 6 described above will be described with reference to FIGS. 7 and 8. FIG. 7 illustrates an enlarged plan view of the A portion of FIG. 6. Also, FIG. 7 illustrates a state in which a protection film PF covering the first wiring W1, the second wiring W2, and a trench TR has not been formed. FIG. 8 is a cross-sectional view illustrating the first example of the wiring structure of the pixel substrate 2 in FIG. 6. FIG. 8 illustrates an enlarged cross-sectional view taken along a B-B section line of FIG. 7.

As illustrated in FIGS. 7 and 8, the pixel substrate 2 (first substrate) includes the organic insulating film IF formed over the TFT substrate 21 (see FIGS. 2, 4, and the like), the first wiring W1 and the second wiring W2 arranged in parallel on the organic insulating film IF, the trench TR formed in the organic insulating film IF between the first wiring W1 and the second wiring W2, and the protection film PF formed to cover the first wiring W1, the second wiring W2, and the trench TR.

The first wiring W1 and the second wiring W2 are the common wiring CMW connected to the drive electrode Tx described above (FIG. 6). For example, the first wiring W1 and the second wiring W2 serving as the common wiring CMW connected to the drive electrode Tx are formed of three layers of metal films.

As illustrated in FIG. 8, the first wiring W1 and the second wiring W2 include first wiring layers W11 and W21, second wiring layers W12 and W22 formed over the first wiring layers W11 and W21, third wiring layers W13 and W23 formed over the second wiring layers W12 and W22, and fourth wiring layers W14 and W24 formed over the third wiring layers W13 and W23, respectively.

Specifically, the first wiring layers W11 and W21 are indium tin oxide (ITO) transparent conductive film. The second wiring layers W12 and W22 are metal films made of molybdenum (Mo). The third wiring layers W13 and W23 are metal films made of aluminium (Al). The fourth wiring layers W14 and W24 are metal films made of molybdenum (Mo).

Also, the protection film PF is a protection film made of silicon nitride (SiN).

Also, regarding the pixel substrate 2, for example, a thickness of the organic insulating film IF is 3 μm, and a thickness of the protection film PF is 120 nm. Regarding each of the first wiring W1 and the second wiring W2, for example, each thickness of the first wiring layers W11 and W21 is 50 nm, each thickness of the second wiring layers W12 and W22 is 10 nm, each thickness of the third wiring layers W13 and W23 is 150 nm, and each thickness of the fourth wiring layers W14 and W24 is 10 nm. The thickness referred to herein is a size in a longitudinal direction in FIG. 8.

Also, regarding the pixel substrate 2, for example, each width of the first wiring W1 and the second wiring W2 is 6 μm, and a width between the first wiring W1 and the second wiring W2 is 9 μm. The width referred to herein is a size in a lateral direction in FIG. 8.

In the wiring structure illustrated in FIG. 8, a depth of the trench TR is formed to be at least ⅓ or more of the thickness of the organic insulating film IF. Specifically, the depth of the trench TR is designed to be a size within a range of ⅓ to ⅔ of the thickness of the organic insulating film IF. For example, when the thickness of the organic insulating film IF is 3 μm, the depth of the trench TR is formed to be 1 to 2 μm. In this case, the remaining organic insulating film IF under the trench TR has a thickness of 2 to 1 μm. The depth and the thickness referred to herein is sizes in the longitudinal direction in FIG. 8.

According to the first example of the wiring structure illustrated in FIGS. 7 and 8, formation of the trench TR in the organic insulating film IF between the first wiring W1 and the second wiring W2 can prevent the chemical reaction caused by moisture infiltrating into the panel. As a result of forming and studying the panel in this structure by the present inventor, corrosion of a wiring and occurrence of bubbles have not been confirmed. The thickness of the organic insulating film IF between the first wiring W1 and the second wiring W2 is formed to be ⅔ or smaller of the thickness of the other regions, so that an amount of moisture penetrating inside the organic insulating film IF can be considerably reduced. As a result, lowering in resistance of the organic insulating film IF is reduced, and accordingly, current flowing in the organic insulating film IF can be decreased, whereby an effect of preventing electrolysis can be achieved.

Also, the trench TR is formed in the organic insulating film IF between the first wiring W1 and the second wiring W2, so that a passage for moisture going through the interface of the organic insulating film IF to penetrate can be made longer. As a result, an effect of improving resistance to water can be achieved.

In the first example of the wiring structure illustrated in FIGS. 7 and 8, the first wiring W1 and the second wiring W2 are wirings in a state in which potentials are different from each other. The first wiring W1 is a wiring supplying voltage to the drive electrode Tx1 in FIG. 6, and the second wiring W2 is a wiring supplying voltage to the drive electrode Tx2 in FIG. 6. Each drive electrode Tx functions as an electrode detecting proximity or contact of an object during a touch detection period. During the touch detection period, since each drive electrode Tx is sequentially driven, while the first wiring W1 supplies voltage VH to the drive electrode Tx1, the second wiring W2 supplies voltage VL to the drive electrode Tx2. That is, during the touch detection period, a state in which potentials are different between the wirings connected to the drive electrodes Tx occurs, and particularly, a potential difference occurs between the adjacent wirings connected to the different drive electrodes Tx.

More specifically, each of the first wiring W1 and the second wiring W2 are formed of a plurality of wires, and a plurality of first wirings W1 (two wires illustrated in FIG. 7) and a plurality of second wirings W2 (two wires illustrated in FIG. 7) are arranged in parallel on the organic insulating film IF. In this case, the trench TR is formed in the organic insulating film IF between the adjacent first wiring W1 and second wiring W2. Moreover, each trench TR is also formed in the organic insulating film IF between the adjacent first wirings W1 and between the adjacent second wirings W2.

Thus, although not limited to the organic insulating film IF between the adjacent first wiring W1 and second wiring W2, the trench TR is also formed in the organic insulating film IF between the adjacent first wirings W1 and between the adjacent second wirings W2, so that a passage in the organic insulating film IF through which moisture penetrates can be made small and a passage at the interface of the organic insulating film IF along which moisture goes can be made longer. Accordingly, the chemical reaction caused by moisture can be prevented more effectively. As a result, resistance to water can be more improved.

<<Second Example of Wiring Structure of Pixel Substrate>>

Figure 9:
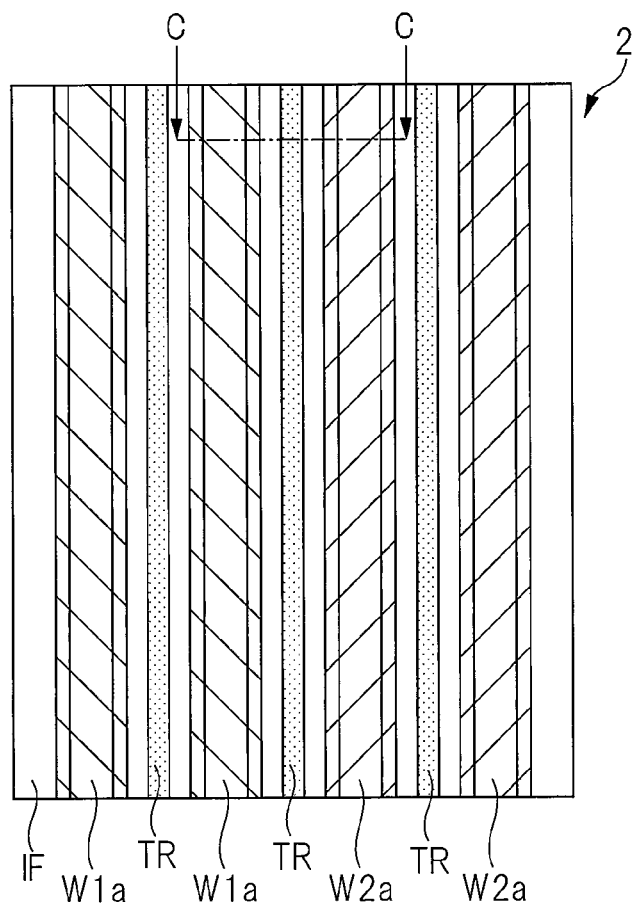
FIG. 9 is a plan view illustrating a second example of the wiring structure of the pixel substrate in FIG. 6.
Figure 10:
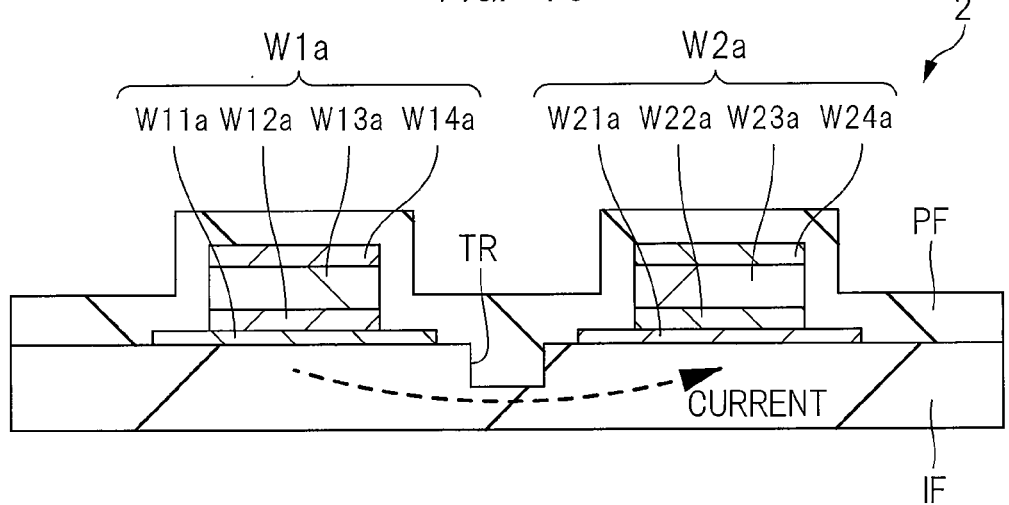
FIG. 10 is a cross-sectional view illustrating the second example of the wiring structure of the pixel substrate in FIG. 6.

The second example of the wiring structure of the pixel substrate 2 in FIG. 6 described above will be described with reference to FIGS. 9 and 10. FIG. 9 is a plan view illustrating the second example of the wiring structure of the pixel substrate 2 in FIG. 6. FIG. 9 illustrates a plan view of the enlarged portion (A portion) in FIG. 6. FIG. 10 is a cross-sectional view illustrating the second example of the wiring structure of the pixel substrate 2 in FIG. 6. FIG. 10 illustrates an enlarged cross-sectional view taken along a C-C section line of FIG. 9. A difference from the first example described above will be mainly described here.

As illustrated in FIGS. 9 and 10, regarding each of a first wiring W1a and a second wiring W2a, each width of first wirings W11a and W21a is larger than each width of second wirings W12a and W22a, third wirings W13a and W23a, and fourth wirings W14a and W24a.

For example, when a width between the first wiring W1a and the second wiring W2a is 9 μm, regarding each of the first wiring W1a and the second wiring W2a, each width of the first wirings W11a and W21a is 10 μm, and each width of the second wirings W12a and W22a, the third wirings W13a and W23a, and the fourth wirings W14a and W24a is 6 μm. In this case, each width of the first wirings W11a and W21a is larger by 2 μm for each side in a width direction than each width of the second wirings W12a and W22a, the third wirings W13a and W23a, and the fourth wirings W14a and W24a. The width referred to here is a size in a lateral direction in FIG. 10.

According to the second example of the wiring structure illustrated in FIGS. 9 and 10, as a different effect from the first example, by applying a stepped structure to each wiring section of the first wiring W1a and the second wiring W2a, a covered state by the protection film PF can be improved. As a result, infiltration of moisture can be prevented, and an effect of further improving resistance to water can be achieved.

The pixel substrate 2 of the wiring structure of the first example (second example) described above can be formed, for example, through the following steps, in a method of manufacturing the liquid crystal display device 1 with a touch detection function. At a step of forming the pixel substrate 2, after the organic insulating film IF is formed over the TFT substrate 21, the trench TR is formed in the organic insulating film IF between the first wiring W1 (W1a) and the second wiring W2 (W2a) which are to be formed at the next step. Further, the first wiring W1 (W1a) and the second wiring W2 (W2a) are formed in parallel on the organic insulating film IF. Then, the protection film PF is formed to cover the first wiring W1 (W1a), the second wiring W2 (W2a), and the trench TR, whereby the pixel substrate 2 can be formed.

Then, the pixel substrate 2 formed in the above-described manner and the counter substrate 3 formed at a different step are arranged to face each other, and a peripheral portion of the pixel substrate 2 and a peripheral portion of the counter substrate 3 are adhesively fixed to each other via a sealing member. Accordingly, the liquid crystal display device 1 with a touch detection function is obtained.

According to the present embodiment described above, the liquid crystal display device 1 with a touch detection function adaptable to high temperature and high humidity environmental condition and capable of detecting proximity or contact of an object based on changes in electrostatic capacitance can be provided. For example, also in the high temperature and high humidity environmental test for the liquid crystal display device 1 with a touch detection function according to the present embodiment, the chemical reaction caused by moisture infiltrating into the panel due to a potential difference between the wirings can be prevented. As a result, no corrosion of the wirings occurs, and further, no bubbles occur in the panel.

In the foregoing, the invention made by the inventor of the present invention has been concretely described based on the embodiment. However, it is needless to say that the present invention is not limited to the foregoing embodiment and various modifications and alterations can be made within the scope of the present invention.

In the above embodiment, an example of the liquid crystal display device 1 with a touch detection function has been disclosed; however, the present invention can be applied to even a liquid crystal display panel without a touch detection function, as long as the display panel has a layer structure in which a plurality of wirings are formed on the organic insulating film, since it is assumed that such panel has the similar problem to be solved. Also, as another application example, various flat-panel display devices such as an organic EL display device, a self-luminous display device other than the organic EL display device, or an electronic paper display device having an electrophoretic element or the like are applicable.

Various modifications and alterations can be conceived by those skilled in the art within the spirit of the present invention, and it is understood that such modifications and alterations are also encompassed within the scope of the present invention. For example, those skilled in the art can suitably modify the above-described embodiment by addition, deletion, or design change of components, or by addition, omission, or condition change of steps. Such modifications are also encompassed within the scope of the present invention as long as they include the gist of the present invention.

Those apparent from the description of the specification or suitably conceivable by those skilled in the art about other advantageous effects generated by the aspects described in the present embodiment are considered by being generated by the present invention as a matter of course.

What is claimed is:

1. A display device comprising a substrate in which a plurality of wirings and a plurality of switching elements are formed,
   the substrate comprising:
   an organic insulating film formed over the substrate;
   a first stack wiring pattern and a second stack wiring pattern arranged in parallel on the organic insulating film;
   a trench formed in the organic insulating film between the first stack wiring pattern and the second stack wiring pattern; and
   a protection film formed to cover the first stack wiring pattern, the second stack wiring pattern, and the trench.

2. The display device according to claim 1,
   wherein a depth of the trench is a size within a range of ⅓ or more of a thickness of the organic insulating film.

3. The display device according to claim 1,
   wherein the first stack wiring pattern and the second stack wiring pattern differ from each other in potential.

4. The display device according to claim 3,
   wherein the first stack wiring pattern supplies a voltage of a first potential to a first electrode, and
   wherein the second stack wiring pattern supplies a voltage of a second potential to a second electrode.

5. The display device according to claim 4,
   wherein each of the first electrode and the second electrode functions as an electrode of detecting proximity or contact of an object and as an electrode of displaying an image.

6. The display device according to claim 1,
   wherein the first stack wiring pattern is formed of a plurality of first wirings and the second stack wiring pattern is formed of a plurality of second wirings,
   wherein the plurality of the first wirings and the plurality of the second wirings are each arranged in parallel on the organic insulating film, and
   wherein the trench is formed in the organic insulating film between the adjacent first stack wiring pattern and second stack wiring pattern.

7. The display device according to claim 1,
   wherein each of the first stack wiring pattern and the second stack wiring pattern includes:
   a first wiring layer formed on the organic insulating film;
   a second wiring layer formed over the first wiring layer;
   a third wiring layer formed over the second wiring layer; and
   a fourth wiring layer formed over the third wiring layer.

8. The display device according to claim 7,
   wherein, in each of the first stack wiring pattern and the second stack wiring pattern, a width of the first wiring layer is larger than each width of the second wiring layer, the third wiring layer, and the fourth wiring layer.

9. The display device according to claim 8,
   wherein the first wiring layer is formed of ITO, and
   wherein each of the second to fourth wiring layers is formed of a metal.

* * * * *